(12) United States Patent
Kley (10) Patent No.: US 7,946,020 B2
(45) Date of Patent: May 24, 2011

(54) MANUFACTURING OF MICRO-OBJECTS SUCH AS MINIATURE DIAMOND TOOL TIPS

(75) Inventor: Victor B. Kley, Berkeley, CA (US)

(73) Assignee: General Nanotechnology LLC, Berkeley, CA (US)

( * ) Notice: Subject to any disclaimer, the term of this patent is extended or adjusted under 35 U.S.C. 154(b) by 1196 days.

(21) Appl. No.: 11/531,541

(22) Filed: Sep. 13, 2006

(65) Prior Publication Data

US 2007/0068995 A1   Mar. 29, 2007

Related U.S. Application Data

(60) Provisional application No. 60/720,785, filed on Sep. 26, 2005.

(51) Int. Cl.
*B23Q 3/00* (2006.01)
*A47J 36/02* (2006.01)

(52) U.S. Cl. .......................... 29/467; 228/101

(58) Field of Classification Search .......... 29/467, 29/428, 718, 283.5, 464, 469, 505, 525, 34 R, 29/566, 566.1; 228/101; 206/372
See application file for complete search history.

(56) References Cited

U.S. PATENT DOCUMENTS 6,199,269 B1 * 3/2001 Greco et al. ............. 29/700

\* cited by examiner

*Primary Examiner* — John C Hong
(74) *Attorney, Agent, or Firm* — Kilpatrick Townsend & Stockton LLP

(57) ABSTRACT

Techniques for affixing a micro-object to a mounting structure at a desired relative orientation. A shaped portion of a work piece is caused to become embedded in two or more reference structures at stages during fabrication. The micro-object may have dimensions less than 200 microns, and possibly on the order of 15-25 microns. The mounting structure may be formed with a blind recess or a through aperture in which the micro-object is mounted.

22 Claims, 8 Drawing Sheets

FIG. 3E

MANUFACTURING OF MICRO-OBJECTS SUCH AS MINIATURE DIAMOND TOOL TIPS

CROSS-REFERENCES TO RELATED APPLICATIONS

This application claims the benefit of U.S. Provisional Application No. 60/720,785, filed Sep. 26, 2005, for "Manufacturing of Micro-Objects Such as Miniature Diamond Tool Tips," the entire disclosure of which is incorporated by reference.

BACKGROUND OF THE INVENTION

The present invention relates generally to the manufacture and handling of micro-objects such as shaped tool heads or tips, and more particularly to the manufacture of miniature tools incorporating or consisting of shaped structures.

Manufacturing and other processes pertaining to scanning probe microscopy, nanomachining, micromachining, machining, optics, biotechnology, and biomedicine often require highly specialized miniature tools. Such tools typically consist of a shaped tool head formed and parted from a diamond or other hard material work piece and mounted on a body or handle. Depending on the particular application, the spatial orientation of the tool head relative to the tool body, once mounted thereupon, may be critical to the usefulness of the miniature tool.

Execution of present methods for handling, aligning and mounting small structures, particularly structures smaller then 200 microns (referred to as micro-objects), is highly difficult and often results in uncertain orientation of the fine tool head structure relative to the tool body. Further precise alignment and rigid coupling between the tool head and tool body is an important and is a real issue which has emerged in the real world application of this invention. Additionally, the miniature tool head, once separated from the work piece from which it is formed or lapped, is easily misplaced in an attempt at further manipulation. Additionally, present methods employed in attempts at miniature tool head mass production are unable to provide consistently accurate precision in cutting or parting off the tool head. It is further desirable to be able to hand off the tool head to a second, third or n manipulator (reference structure) engaging the head at or near the cut or elsewhere along the body of the work piece or tool piece.

U.S. Pat. No. 6,931,710, issued Aug. 23, 2005 to Victor B. Kley for "Manufacturing of Micro-Objects Such as Miniature Diamond Tool Tips" discloses techniques for producing and affixing a micro-object to a mounting structure at a desired relative orientation. In a disclosed embodiment, a shaped portion of a work piece is caused to become embedded in a reference structure at a first relative orientation. The work piece is parted into first and second portions, the first portion of which includes the embedded shaped portion of the work piece and defines the micro-object. The reference structure is then aligned with the mounting structure at a second relative orientation, the first and second relative orientations defining the desired relative orientation of the micro-object and the mounting structure. The micro-object is bonded to the mounting structure while the micro-object remains embedded in the reference structure and the reference structure remains aligned with the mounting structure at the second relative orientation. The micro-object is then separated from the reference structure, whereupon the micro-object remains in the desired relative orientation with respect to the mounting structure.

Further, where it is also desired to have the mounted micro-object at a particular location relative to the mounting structure, the work piece is embedded at a first relative position on the reference structure, and the reference structure is aligned at a second relative position with respect to the mounting structure. The first and second relative positions thus define the desired location of the micro-object on the mounting structure. It is pointed out that the reference structure and the embedded shaped portion of the work piece after parting represents a useful article of manufacture as an intermediate to the ultimate manufacture of the composite article comprising the micro-object bonded to the mounting structure.

SUMMARY OF THE INVENTION

Embodiments of the present invention provide improved techniques for mounting micro-objects (e.g., tool tips) to mounting structures (e.g., cantilevers). Embodiments may provide one or more of the advantages listed herein.

It is desirable where possible to provide a rigid coupling as or as part of the reference structure to insure a good mechanical coupling between the micro-object and the mounting structure or tool holder. In an embodiment, the rigid coupling is provided by a blind recess (cavity), or a through hole (aperture) which is an interference, friction, or close fit with the shape of the tool piece or micro-object to be fit into the tool holder or mounting structure.

It is also desirable to be able to bond tool pieces or tips using bonding processes suitable for the parts and tool head. Further it is desirable to be able to attach parts whose shapes are larger at the tool piece end away from the bond area. Further still it is desirable to provide a recess or through hole in the tool head such that substantial support is provided to the tool piece along its length. Embodiments may provide one or more of these features.

A further embodiment employs a second embedding reference structure with a means complementary to the first reference structure to provide for further manipulation of the structure. Indeed additional reference structures may be employed so as to grasp the work piece from any direction possible for further operations. This ability is obtained for example by using an element such as a thermal plastic on a temperature controlled reference structure to engage the work piece portion and then, on cooling, bond it temporarily for repositioning or transitioning to another reference structure. Alternatively a photo-reactive bond may also be used to engage the work piece, or an electrostatic or magnetically controllable viscosity may also be used as the engaging element. Where the work piece is shaped to permit a positive engagement a mechanical clamp operated by magnetic, mechanical, thermal or electrostatic means may also serve the purpose.

In yet another embodiment the tip for measurement or other operation or tool piece is mounted directly on the cantilever or tool body by bonding the tool piece prior or in conjunction with laser, ion beam, electron beam, or ion or e-beam chemically induced etching of the diamond tool piece from the bulk part from which it was formed. In this way negative or inward going shapes may be easily made and mounted by a one step transfer process. Further the tool piece may be placed at an angle for bonding which compensates the cantilever angle or tool body angle so as to present the proper angle for the tip or tool piece.

Additionally the cavity or through hole shaped as above to fit the tip or tool piece shape along the direction orthogonal to the tool piece axis but parallel to the plane of the cantilever or tool body on the tool body or cantilever can be formed by a suitable process such as dry etching or wet etching so as to obtain a tapered cavity on the tool body cavity or through hole not matching the shape along the tool axis so as to form a wedge of material to prevent motion of the straight sided, outward or inward tapered tool piece out of the cavity in a direction which compresses the wedges. A bond which has good adhesion may also be used with the tool piece to prevent its relative motion in any direction with respect to the tool body. Finally the through hole is designed to limit the depth of insertion of the tip or tool piece by the effective diameter of the tool piece or tip in a constant hole to allow a wide tolerance for tip sharpness particularly for negative angled tips or tool pieces.

Bonding can be accomplished by use of any combination of solders, silver solders, welding of metals such as the Ti, Ni, Cu bond disclosed in earlier art, eutectic solders, including an adhesion layer of Ti combined with a Au layer or Ag then Au layer on each part, epoxies, uv curable epoxies, thermal curable epoxies, and other glues and materials well known in the art.

A further understanding of the nature and advantages of the present invention may be realized by reference to the remaining portions of the specification and the drawings.

DESCRIPTION OF SPECIFIC EMBODIMENTS

Figure 1A:
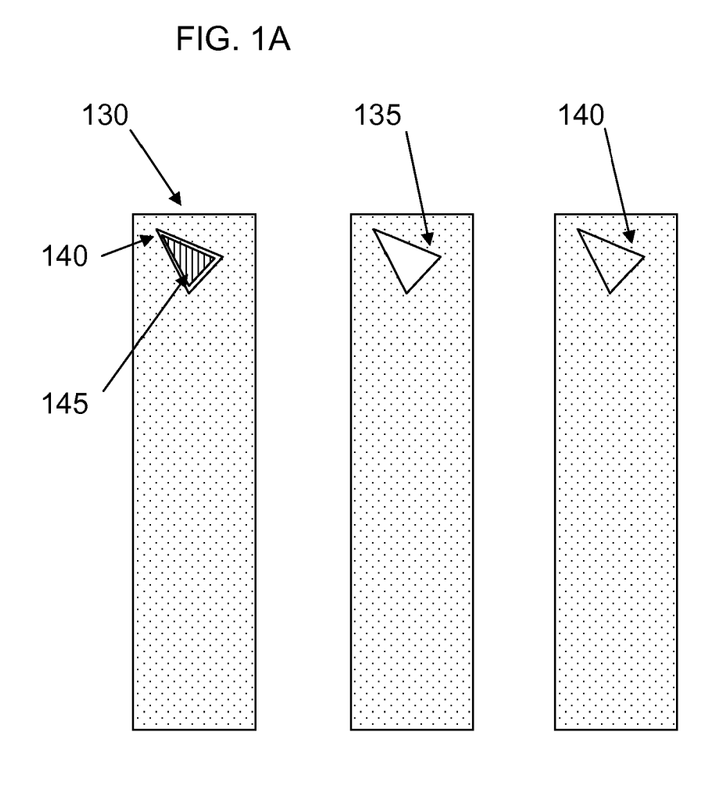
FIG. 1A is a top plan view of a tool and tool body with rigid coupling mounting structure according to principles of the present invention.

FIG. 1A shows an alternative form for a tool holder 130 with rigid reference coupling 135 or 140 assembled with tool piece 145. The example tool holder is a cantilever useful in AFM guided nanomachining and has one of two structures, a through hole 135 in the holder shaped so that it can accept the tool base shape, or a recess 140 partially through the tool holder otherwise identical to through hole 135.

As shown in the top plan view, tool holder 130 has tool 145 in place in recess 140, and there is some space or tolerance between the recess sides and the tool tip. This tolerance may be anything from less then zero (press fit) to many microns in accordance with the purpose and properties of the tool and tool holder.

Figure 1B:
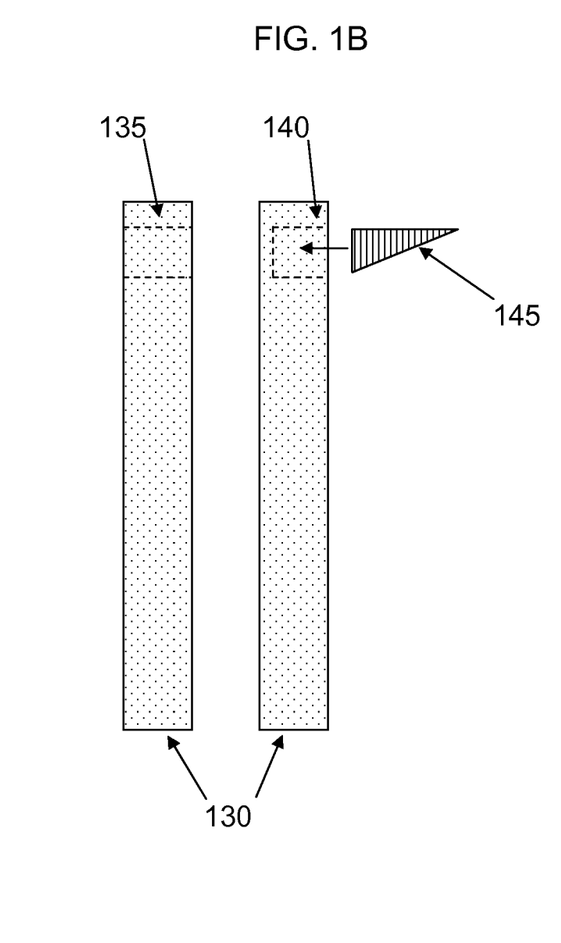
FIG. 1B is a side plan view of a tool and tool body with rigid coupling mounting structure according to principles of the present invention.

FIG. 1B shows a side plan view of the example tool holder 130 with both a through hole 135 and a recess 140 along with a side view of the tool piece 145. As is indicated by the arrow at the base of 145 the tool piece is meant to be inserted into the recess which also sets its angles with respect to the holder. The tool piece may be retained by any common means including glue, solder, metal bond, anodic bond, friction or interference fit with or without thermal treatment to cause enlargement of the shaped opening 135 or 140.

Figure 2A:
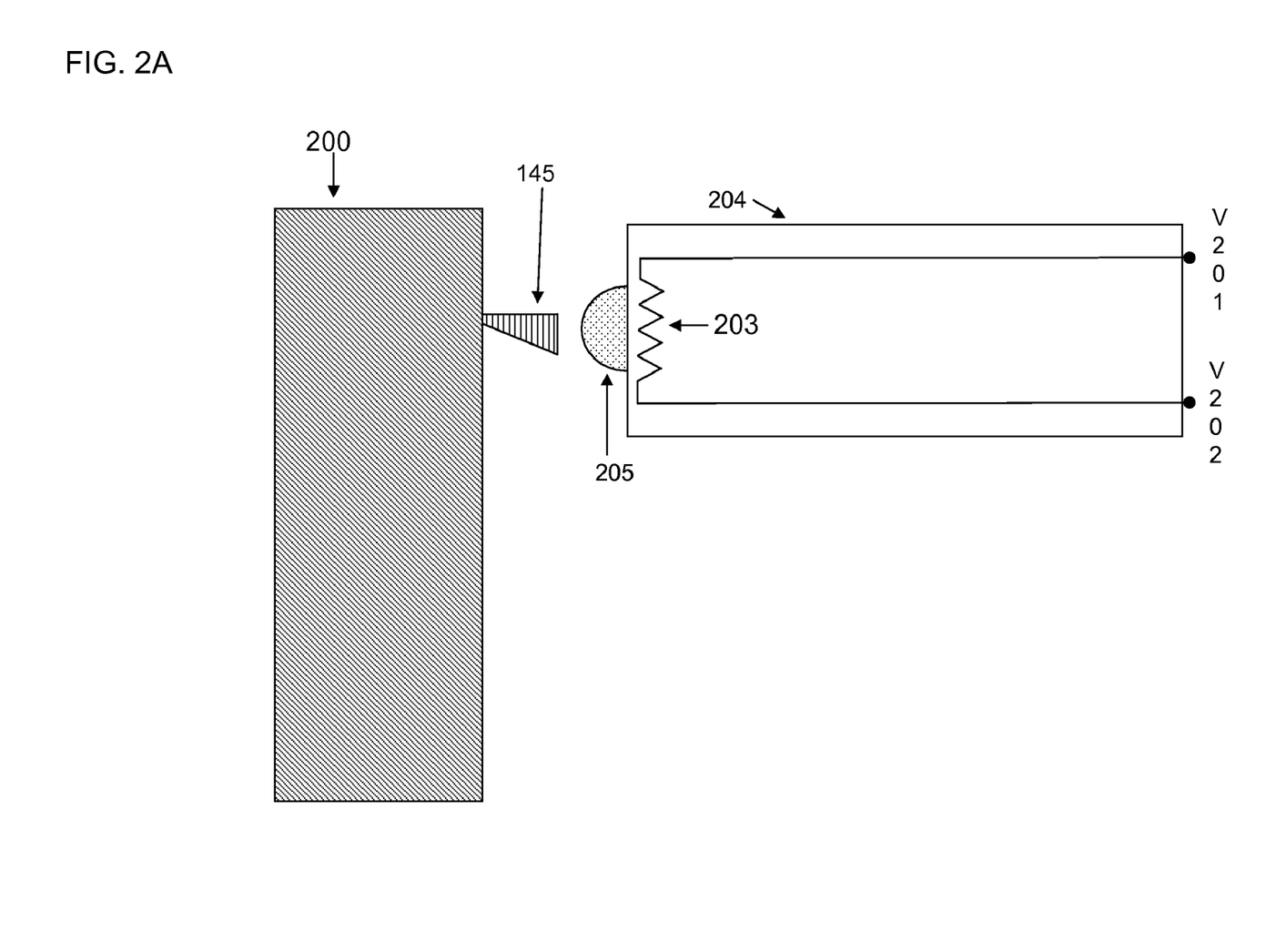
FIG. 2A is a side plan view of first and second reference structures, the latter being shown with a thermally/releasable element.

FIG. 2A shows a side plan view of a first reference structure 200 and tool piece 145 along with a second reference structure 204 with attached thermal material (such as a low temperature thermal plastic, eutectic metal, wax, or solder) which can be softened by application of current flowing between terminals 201 and 202 through a resistive element 203.

Figures 2B, 2C:
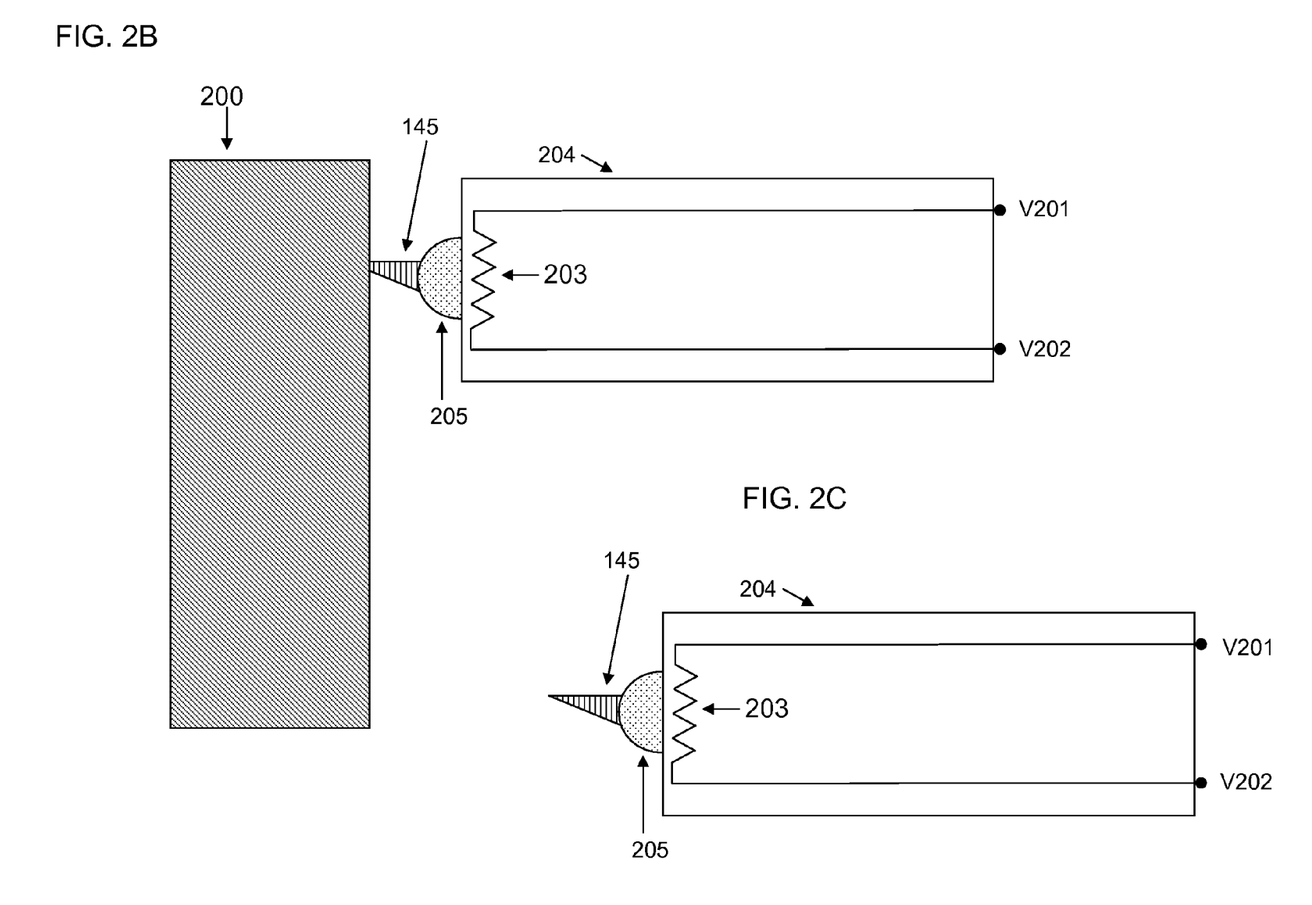
FIG. 2B is a side plan view of the second reference structure with thermal member engaging the work piece after it has been trimmed while engaged by the first reference structure.
FIG. 2C is a side plan view of the second reference structure after the thermal element has cooled and the work piece is removed from the first reference structure and fully engaged by the second reference structure.

FIG. 2B shows a side plan of the second reference structure with thermal material 205 having engaged tool piece 145.

FIG. 2C shows a side plan view of the second reference structure having been used to remove the tool piece from the first reference structure 200 and ready for the appropriate next operation in any process involving further positioning of the tool piece 145.

Figure 3A:
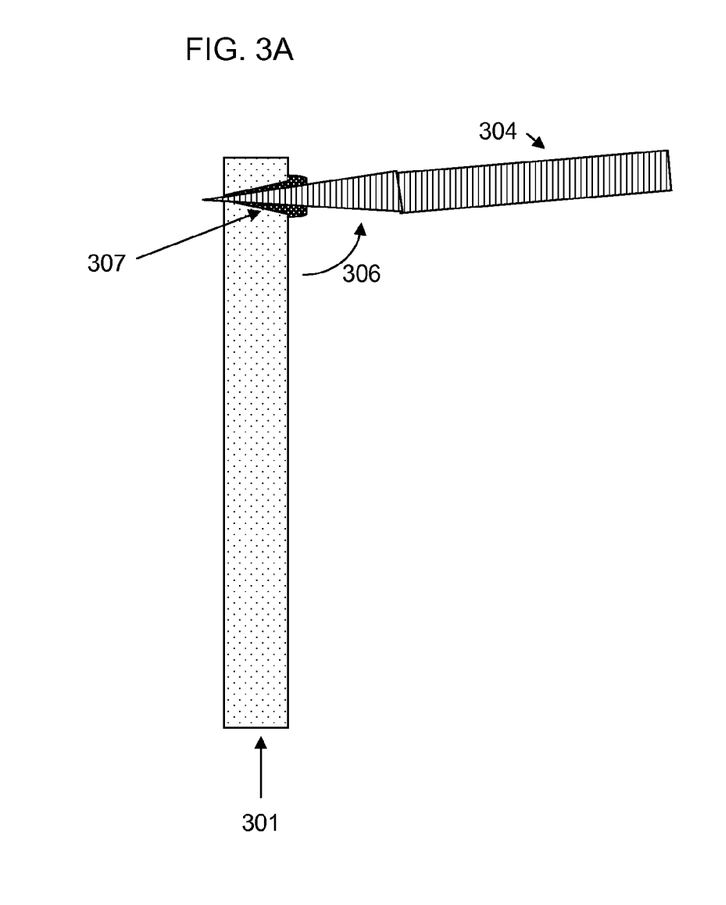
FIG. 3A is a side plan view of a tip or tool piece inserted into a tool body or cantilever through hole, with the tip shown still attached to the bulk from which it is formed in the left-hand portion of FIG. 3A, and the tip is shown separated and bonded to the cantilever in the right-hand portion.

FIG. 3A shows a side plan view of the negative (or zero) angled tool piece (305) along with provisions for attachment to the mounting structure 301. In cantilever structure 301 the unseparated tool piece or tip still attached to the bulk diamond crystal is shown as 304. It is shown as set at an angle 306 to compensate for the tilt of the cantilever so that the final orientation with respect to surface to be measured, scanned or modified is perpendicular to that surface. The intact tip and bulk crystal positioned at the desired orientation in all axes is then soldered and attached by solder forming (or otherwise forming) the bond area 307.

Figure 3B:
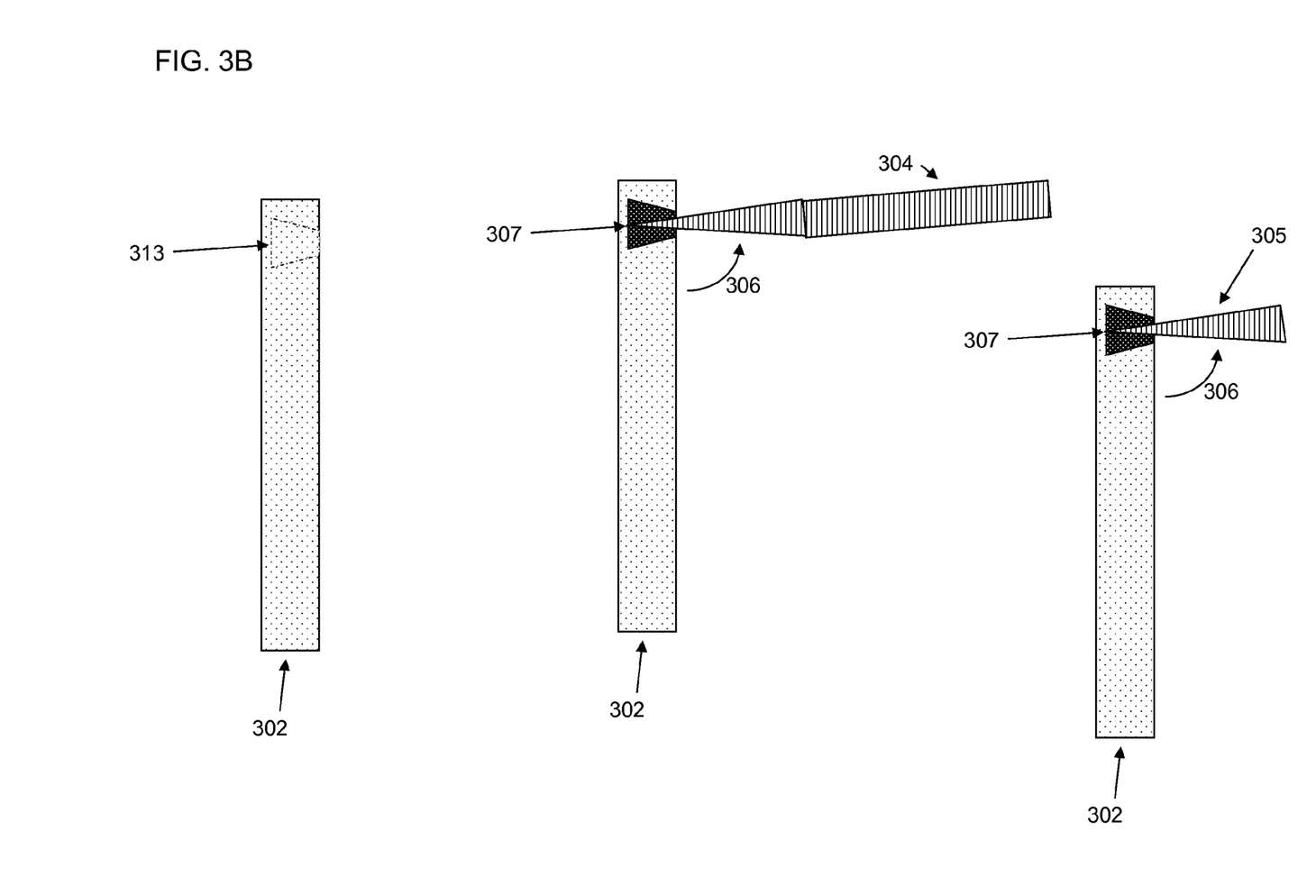
FIG. 3B is a side plan view of three sequential steps in the process of fixing and bonding a tip attached to its bulk work piece and then bonded into a recess in the tool body or cantilever.
Figure 3C:
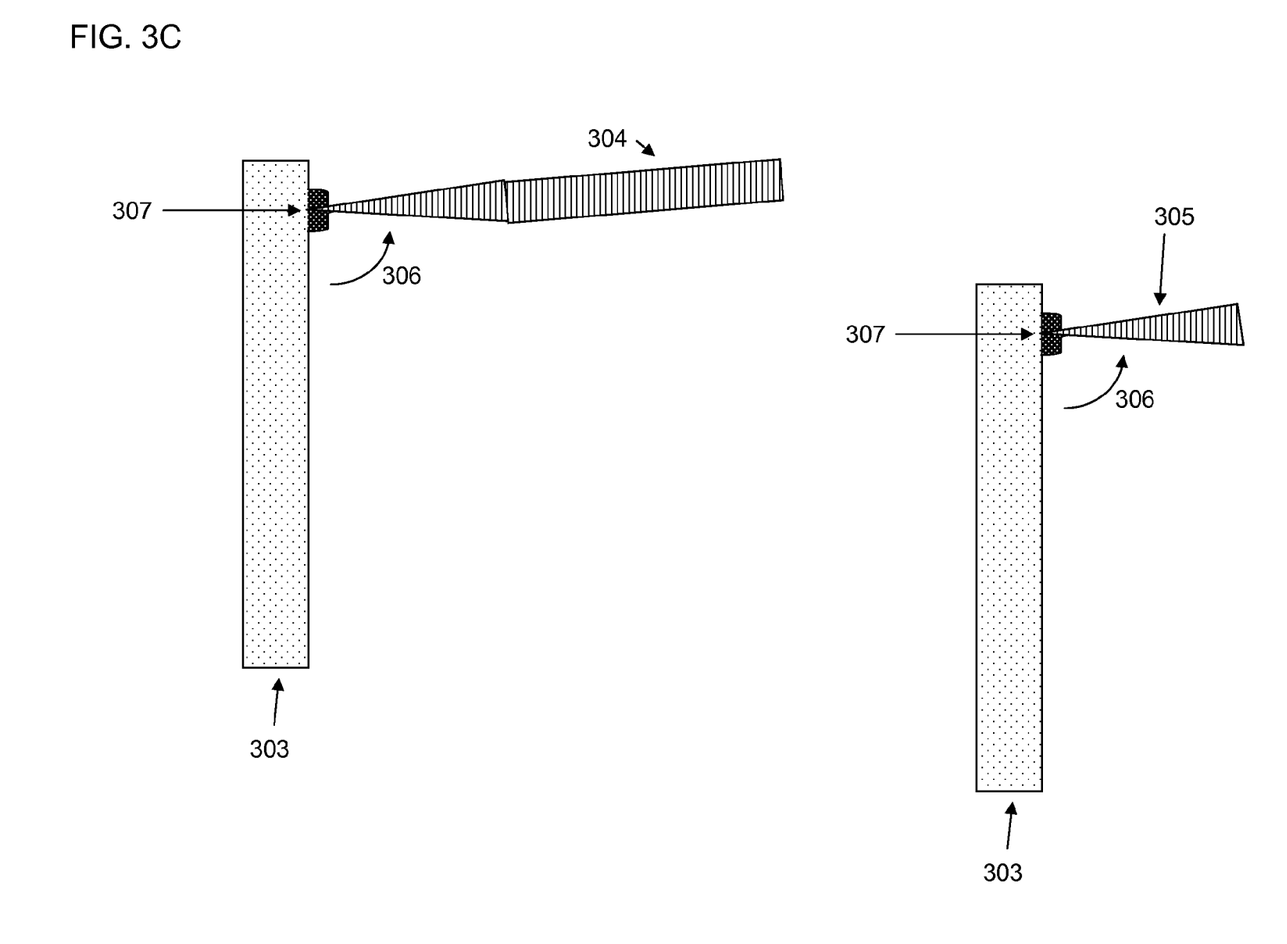
FIG. 3C is a side plan view of two sequential steps showing an attached tip or tool piece with bulk work piece to a simple tool body or cantilever with no through hole or recess before and after the tool piece or tip is parted away.

In FIG. 3B cantilever 302 with prepared recess 313 has the bulk crystal 304 set at an angle 306 to compensate for the tilt of the cantilever so that the final orientation with respect to surface to be measured, scanned or modified is perpendicular to that surface. The bulk tool piece 304 is then attached by bonding means 307. Finally crystal 304 has been trimmed leaving the tip or tool piece 305 oriented and bonded by the bond joint 307 at angle 306. Cantilever 302 has been fashioned with a blind or partially closed cavity. In FIG. 3C the bulk work piece 304 is directly bonded by material 307 on the surface of the cantilever 303. Then the work piece 304 is trimmed to leave the finished tip 305.

Figure 3D:
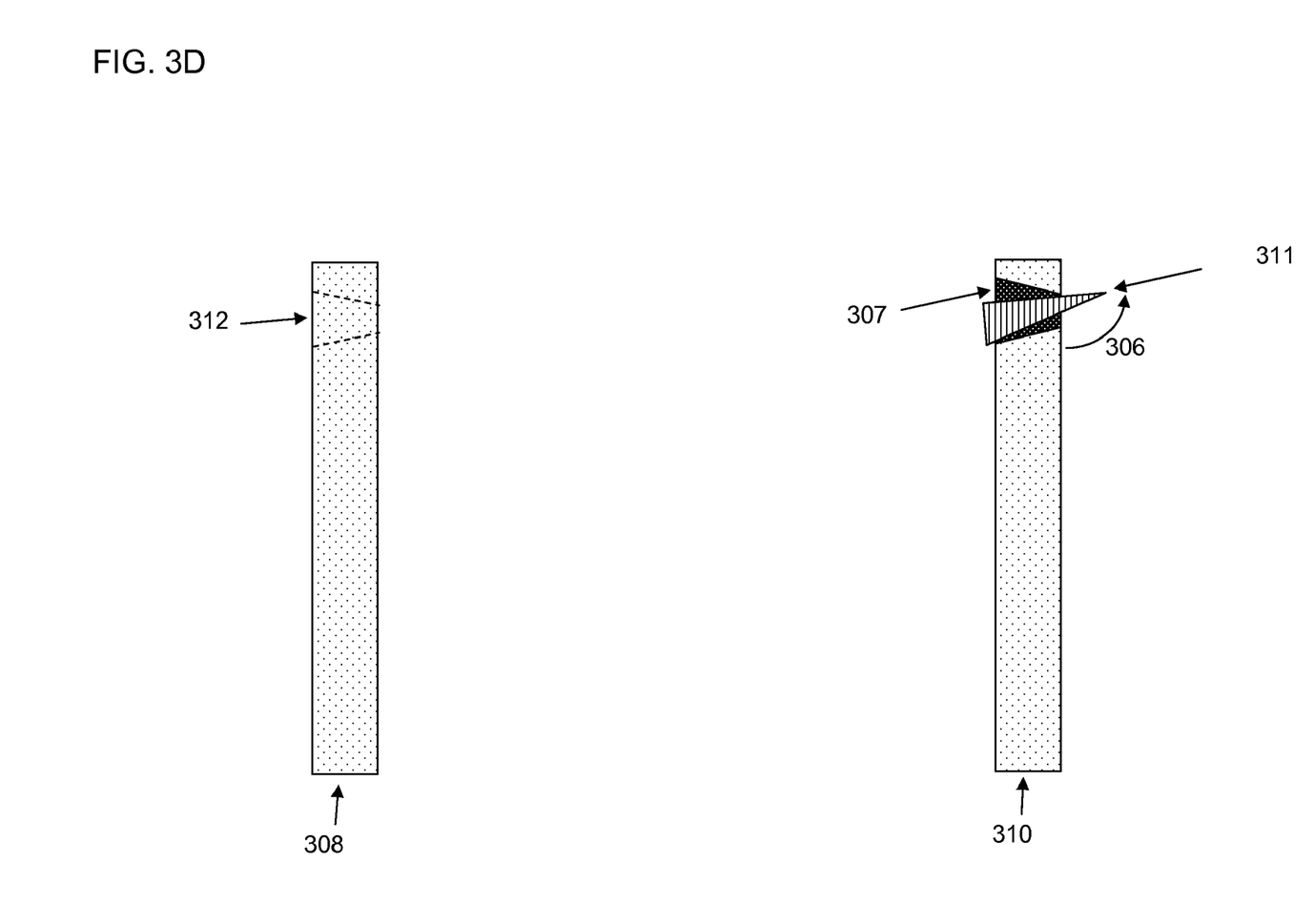
FIG. 3D is a side plan view of two sequential steps in placing and bonding a tool piece or tip in a through hole in the tool body or cantilever.
Figure 3E:
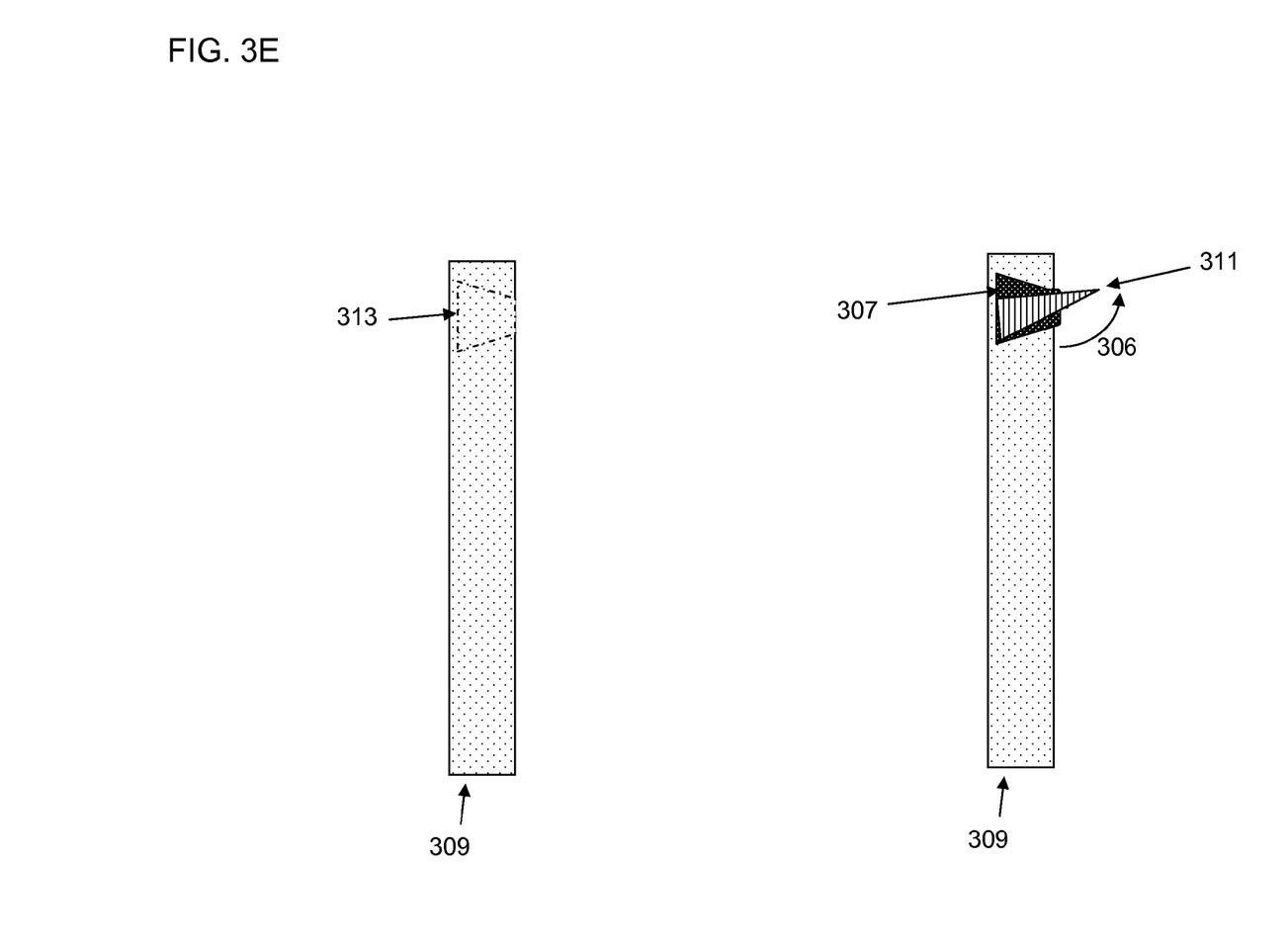
FIG. 3E is a side plan view of two sequential steps in placing and bonding a tool piece or tip in a recess in the tool body or cantilever.

FIG. 3D shows mounting structure 308 formed with a positive angled through hole 312. At 310, mounting structure/cantilever 308 has had tool piece/tip 311 mounted from the left or back side, its angle set and bond 307 has been made. The operation is now complete. FIG. 3E shows cantilever/mounting structure 309 with a recess 313 formed in the cantilever by etching, ion milling, and electron mediated chemical milling or dry etching. Then a tip 311 is placed into the cavity 313 at an orientation and angle 306. Finally bond 307 is made and the assembly is complete.

While the above is a complete description of specific embodiments of the invention, the above description should not be taken as limiting the scope of the invention as defined by the claims.

What is claimed is:

1. A method of affixing a micro-object to a mounting structure at a desired relative orientation, the method comprising:
   embedding a shaped portion of a work piece in a first reference structure at a first relative orientation;
   parting the work piece into first and second portions, the first portion of which includes the embedded shaped portion of the work piece and defines the micro-object;
   embedding the micro-object in or clamping the micro-object by a second reference structure;
   aligning the second reference structure with the mounting structure at a second relative orientation, the first and second relative orientations defining the desired relative orientation of the micro-object and the mounting structure;
   bonding the micro-object to the mounting structure while the micro-object remains embedded or clamped in the second reference structure and the second reference structure remains aligned with the mounting structure at the second relative orientation; and
   separating the micro-object from the second reference structure, whereupon the micro-object remains in the desired relative orientation with respect to the mounting structure.

2. The method of claim 1 wherein the second reference structure and the mounting structure are aligned so as to define a desired relative spatial position between the second reference structure and the mounting structure.

3. The method of claim 1 wherein the micro-object has dimensions that are less than 100 microns.

4. The method of claim 1 wherein the micro-object has dimensions that are on the order of 15-25 microns.

5. The method of claim 1 wherein the micro-object is aligned relative to the mounting structure to an angular precision of ±5 degrees or better.

6. The method of claim 1 in which the mounting structure has been shaped to mate with the micro-object so as to restrain it mechanically.

7. The method of claim 6 in which the micro-object makes a friction fit with the mounting structure.

8. The method of claim 6 in which the micro-object makes interference fit with the mounting structure.

9. The method of claim 6 in which the micro-object is anodically bonded with the mounting structure.

10. The method of claim 6 in which mounting structure has a through aperture which is the reference limit for the insertion of the micro-object.

11. The method of claims 1 wherein the micro-object is transferred to at least one additional reference structure before the final step of attachment to the mounting structure.

12. A method of fabricating a composite article having a micro-object supported on a mounting structure at a desired orientation with respect to the mounting structure, the method comprising:
   providing a work piece having first and second portions, the first portion of the work piece having a shape suitable for defining at least a portion of the micro-object;
   immobilizing the first portion of the work piece relative to a first reference structure with the first portion of the work piece at a first orientation with respect to the first reference structure;
   separating the first portion of the work piece from the second portion of the work piece while maintaining the first portion of the work piece immobilized relative to the first reference structure at the first orientation with respect to the first reference structure, whereupon the first portion of the work piece, so separated, defines the micro-object, with the micro-object, so separated, remaining at the first orientation with respect to the first reference structure;
   immobilizing the second portion of the work piece relative to a second reference structure with the second portion of the work piece at a second orientation with respect to the second reference structure;
   aligning the second reference structure with the mounting structure at a third orientation with respect to the mounting structure, the second orientation of the micro-object relative to the second reference structure and the third orientation of the second reference structure relative to the mounting structure defining the desired orientation of the micro-object with respect to the mounting structure;
   bonding the micro-object to the mounting structure while the micro-object remains immobilized relative to the second reference structure and the second reference structure remains aligned with the mounting structure at the third orientation with respect to the mounting structure; and
   releasing the micro-object from the second reference structure.

13. The method of claim 12 wherein the second reference structure and the mounting structure are aligned so as to define a desired relative spatial position between the second reference structure and the mounting structure.

14. The method of claim 12 wherein the micro-object has dimensions that are less than 200 microns, and the micro-object is aligned relative to the mounting structure to an angular precision of ±5 degrees or better.

15. The method of claim 12 wherein the micro-object has dimensions that are on the order of 15-25 microns.

16. The method of claim 12 wherein said bonding comprises welding a first bonding layer disposed on a surface of the micro-object to a second bonding layer disposed on a surface of the mounting structure, the first and second bonding layers being of the same material.

17. The method of claim 12 wherein said bonding comprises soldering the micro-object to the mounting structure.

18. A method of direct bonding a micro-object to a mounting structure, the method comprising:
   providing a bulk material work piece having first and second portions, the first portion of the work piece having a shape suitable for defining at least a portion of the micro-object;
   separating the first portion of the work piece from the second portion of the work piece while maintaining the first portion of the work piece immobilized relative to the mounting structure; and
   simultaneously partially or fully bonding the micro-object to the mounting structure in conjunction with the separation of the micro-object from the work piece.

19. The method of claim 18 wherein maintaining the first portion of the work piece immobilized relative to the mounting structure includes inserting at least a portion of the first portion of the work piece into a blind recess or through aperture in the mounting structure.

20. A method of direct bonding a micro-object to a mounting structure, the method comprising:

providing a bulk material work piece having first and second portions, the first portion of the work piece having a shape suitable for defining at least a portion of the micro-object;

partially or fully bonding the micro-object to the mounting structure in conjunction while maintaining the first portion of the work piece immobilized relative to the mounting structure; and thereafter, separating the first portion of the work piece from the second portion of the work piece.

21. The method of claim 20 wherein maintaining the first portion of the work piece immobilized relative to the mounting structure includes inserting at least a portion of the first portion of the work piece into a blind recess or through aperture in the mounting structure.

22. The method of claim 21 wherein:

the mounting structure has a through aperture which is the reference limit for the insertion of the first portion of the work piece; and prior to maintaining the first portion of the work piece immobilized relative to the mounting structure, the first portion of the work piece is inserted to the reference limit.

* * * * *